(12) United States Patent
Shen et al.

(10) Patent No.: US 6,218,310 B1
(45) Date of Patent: *Apr. 17, 2001

(54) RTA METHODS FOR TREATING A DEEP-UV RESIST MASK PRIOR TO GATE FORMATION ETCH TO IMPROVE GATE PROFILE

(75) Inventors: Lewis Shen, Cupertino; Wenge Yang, Fremont, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,585

(22) Filed: May 12, 1998

(51) Int. Cl.[7] .................................................. H01L 21/00
(52) U.S. Cl. .......................... 438/714; 438/735; 438/738
(58) Field of Search .................... 438/714, 735, 438/738, 700, 715, 725, 706

(56) References Cited

U.S. PATENT DOCUMENTS

| | | | | |
|---|---|---|---|---|
| 4,645,562 | * | 2/1987 | Liao et al. | 156/643 |
| 5,459,087 | * | 10/1995 | Mochizuki | 437/39 |
| 5,496,438 | * | 3/1996 | Wootton et al. | 456/643.1 |
| 5,503,708 | * | 4/1996 | Koizumi et al. | 156/643.1 |
| 5,503,964 | * | 4/1996 | Nishina et al. | 430/329 |
| 5,770,523 | * | 6/1998 | Hung et al. | 438/725 |
| 5,851,927 | * | 12/1998 | Cox et al. | 438/744 |
| 5,910,453 | * | 6/1999 | Gupta et al. | 438/717 |

* cited by examiner

Primary Examiner—Benjamin L. Utech
Assistant Examiner—Vanessa Perez-Ramos

(57) ABSTRACT

A hard resist layer is formed on and/or within a deep-UV configured resist mask prior to patterning a semiconductor device feature. The hard resist layer reduces the amount of polymer residue generated during the patterning process, which can affect the resulting profile of the device feature. The hard resist mask is formed by subjecting the resist mask to a rapid thermal anneal (RTA) type of process. Because of the hard resist layer, the thickness of the resist mask can also be reduced, thereby increasing the resolution capabilities of the resist mask.

20 Claims, 3 Drawing Sheets

RTA METHODS FOR TREATING A DEEP-UV RESIST MASK PRIOR TO GATE FORMATION ETCH TO IMPROVE GATE PROFILE

RELATED APPLICATIONS

This application is related to co-pending application Ser. No. 09/076,661, filed May 12, 1998, entitled Methods for Treating A Deep-UV Resist Mask Prior To Gate Formation Etch To Improve Gate Profile.

TECHNICAL FIELD

The present invention relates to semiconductor devices and manufacturing processes, and more particularly to methods for treating a deep-ultraviolet (deep-UV) configured resist mask prior to etching at least one underlying layer through the resist mask to form a gate or other device feature in a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

FIG. 1 depicts a cross-section of a portion 10 of a conventional semiconductor wafer that has been prepared for selective patterning of at least one semiconductor device feature. As shown, portion 10 includes a substrate 12, a feature layer 14, and a resist mask 16 that forms windows 17a–c. Substrate 12 is typically a selectively patterned and/or doped semiconductor material having one or more active regions (not shown) that are integral to the semiconductor device. By way of example, if the semiconductor device is a metal oxide semiconductor (MOS) transistor, then the substrate 12 typically includes an active source region, an active drain region, and one or more isolating regions. Feature layer 14, in this case, typically includes a tunnel oxide layer over which at least one electrically conductive layer, for example, polysilicon, is deposited and subsequently patterned to form at least one gate using conventional fabrication techniques. Resist mask 16 typically includes an organic spin-on compound that is selectively exposed to deep-UV radiation and further processed to reveal specific portions of the top surface 15 of feature layer 14 through windows 17a–c, for example.

In order to selectively pattern feature layer 14, portion 10 (i.e., the semiconductor wafer) is normally placed in an etching tool (not shown) and exposed to a plasma that contains reactive and/or ionized species of gas molecules which chemically react and/or physically bombard the exposed portions of feature layer 14. For example, FIG. 2 depicts portion 10 following exposure to a plasma 18 that has removed, or etched away, portions of feature layer 14 to create etched openings 20a, 20b and 20c through windows 17a, 17b and 17c, respectively. Etched openings 20a–c extend through feature layer 14 to reveal portions of top surface 13 of underlying substrate 12.

Resist mask 16, having served its function is then removed, or stripped away, using conventional techniques. FIG. 3 depicts portion 10 after resist mask 16 has been stripped away. As shown, a plurality of device features 14a–d have been selectively formed from feature layer 14. Device features 14a–d, for example, can be gates of MOS transistors.

Controlling the resulting size and/or shape of a device feature (e.g., 14b) is often critical to functioning of the applicable device. For example, in certain semiconductor devices it is preferred that the design feature have substantially planar and/or vertical sidewalls. Further, in certain semiconductor devices having a plurality of like device features it is preferred that each of the device features meet certain size and shape constraints.

With this in mind, there are several problems with the device features 14a, 14b, 14c, and 14d, as depicted in FIG. 3. These problems will be pointed out by referring to device features 14b and 14c. As shown, device features 14b and 14c do not have substantially vertical sidewalls, with respect to top surface 13. In particular, device feature 14b has sloping sidewalls 24a on opposing sides, and device feature 14c has a sloping sidewall 24a adjacent to device feature 14b and a sloping sidewall 24b adjacent to design feature 14d. Notice that the angle, with respect to top surface 13, of sloping sidewalls 24a is different than the angle, with respect to top surface 13, of sloping sidewalls 24b. Consequently, device feature 14b has a different shape and size than device feature 14c.

The difference in shapes of device features 14b and 14c can be traced to the etching process, and more particularly to the resist mask 16. Referring back to FIG. 2, a residue 22 tends to form when plasma 18 contacts resist mask 16 during the etching process. As shown, residue 22 can build up within the etched openings 20a–c, and on the sidewalls of the design features. Residue 22, which typically includes harder to etch polymers, tends to reduce the etching capability of plasma 18 to feature layer 14. As a result, the sidewalls of the various device features tends to be non-vertical and in certain cases non-planar, as well.

The final shape of a given sidewall depends on several factors, including the amount of residue 22 that actually forms. The amount of residue 22 that forms appears to depend, at least partially, on the window 17a–c (e.g., shape, size, width, thickness, etc.) formed by resist mask 16. For example, since window 17c is wider than windows 17a and 17b there tends to be more residue 22 build-up within etched opening 20c, which is formed through window 17c. Consequently, device features 14b and 14c are shaped differently and may perform differently.

Thus, there is a need for methods that provide increased process control during the formation of device features by reducing the deleterious effects of residue build-up.

SUMMARY OF THE INVENTION

The present invention provides methods that provide increased process control during the formation of device features. In accordance with certain aspects of the present invention, the amount of residue build-up is significantly reduced, if not substantially eliminated, by altering the resist mask prior to patterning the underlying layer and/or layers to form a device feature.

Thus, in accordance with certain embodiments of the present invention, a method for fabricating a device feature in a semiconductor device is provided. The method includes forming a second layer on a first layer and forming a resist mask on the second layer, wherein the resist mask has at least one opening that exposes a selected portion of a top surface of the underlying second layer. The method further includes raising the temperature of at least a portion of the resist mask sufficient to form a hard resist layer within the resist mask sufficient, and then etching through the selected portion of the second layer to expose a portion of the first layer. In accordance with certain preferred embodiments of the present invention, the step of raising the temperature of at least a portion of the resist mask further includes placing the semiconductor device in a chamber having an initial temperature that is less than about 150° C., and raising the temperature in the chamber from the initial temperature to a second temperature that is at least about 150° C. for a defined period of time. By way of example, in accordance with certain embodiments if the present invention, the second temperature is between about 150° C. and about 450° C., and/or the defined period of time is less than about 60 seconds.

The above stated needs and others are also met by a method for forming a hardened resist layer within a resist mask using rapid thermal anneal techniques, in accordance with still further embodiments of the present invention. The method includes forming a resist mask on a top layer of a layer stack, wherein the resist mask comprises a plurality of polymer molecules, and thermally heating at least a portion of the plurality of polymer molecules in the resist mask sufficient to form a hardened resist layer with cross-linked chains of polymer molecules in the resist mask. In accordance with certain embodiments of the present invention, the step of heating at least a portion of the plurality of polymer molecules in the resist mask includes rapidly heating for a defined period of time, a portion, but not all, of the plurality of polymer molecules in the resist mask to a linking temperature that is at least about 150° C. By way of example, in accordance with certain embodiments of the present invention, the linking temperature is between about 150° C. and about 450° C. and/or the defined period of time is less than about 60 seconds.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

As described below and depicted in FIGS. 4–8, in accordance with certain embodiments of the present invention, an increase in process control during the selective etching of one or more device features from a feature layer is achieved by forming a hard resist layer within a resist mask. This hard resist layer significantly reduces, if not substantially eliminates, the build-up of residue during the subsequent etching process. Consequently, the profiles of the resulting device features are significantly improved, e.g., they are more vertical and/or uniform in shape/size. Further, the thickness of the resist mask can be reduced because of the added protection of the hard resist layer which effectively reduces the amount of resist material that is removed during the etching process. Thus, a thinner resist mask can be used to increase the etching resolution, and/or lengthen the associated etching process window. This allows for increased process control during the etching process.

Figure 1:
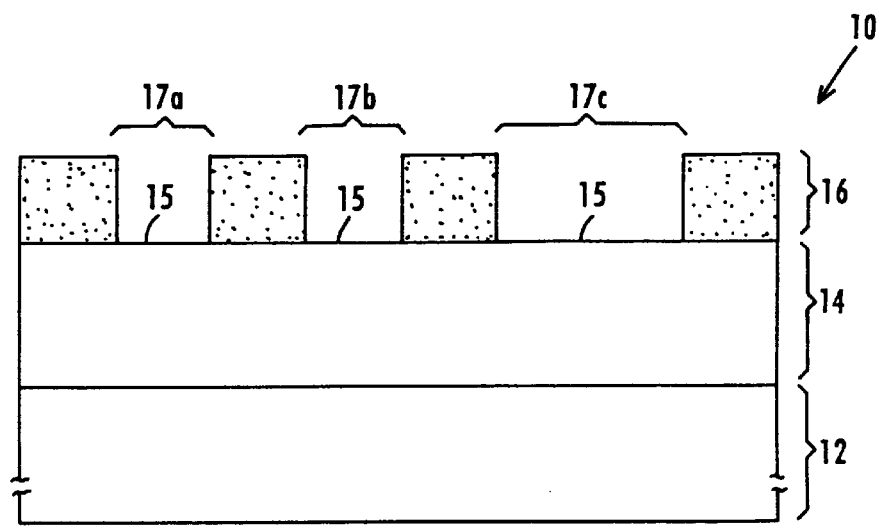
FIG. 1 depicts a cross-sectional view of a portion of a typical prior art semiconductor device prior to the formation of a plurality of device features.
Figure 2:
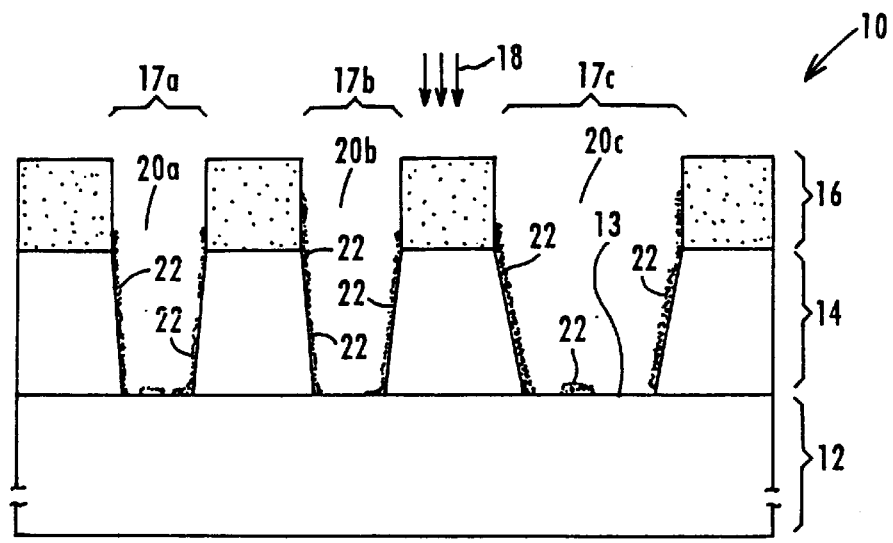
FIG. 2 depicts a cross-sectional view of the portion of FIG. 1 following a selective etching process in which a plurality of device features are patterned through windows in a conventional resist mask.
Figure 4:
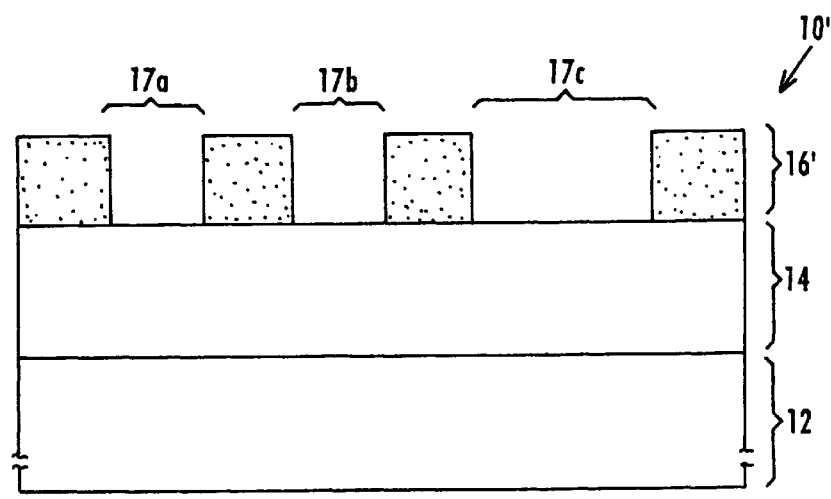
FIG. 4 depicts a cross-sectional view of a portion of a semiconductor device prior to the formation of a plurality of device features, in accordance with certain embodiments of the present invention.

A cross-sectional view of an exemplary portion 10' of a semiconductor wafer, which is similar to portion 10 in FIG. 1, is depicted in FIG. 4. Portion 10' includes a substrate 12 upon which a feature layer 14 is formed. Feature layer 14 can be a single layer of material or can include a plurality of layers of materials that are deposited to form a layer stack. By way of example, in certain exemplary embodiments, feature layer 14 is configured to form one or more gates of MOS transistors, and, as such, includes a thin layer of silicon dioxide that is thermally grown using conventional techniques on substrate 12, and an overlying layer of polysilicon that is deposited over the thin layer of silicon dioxide using conventional chemical vapor deposition (CVD) and/or plasma enhanced chemical vapor deposition (PECVD) techniques.

Resist mask 16', in accordance with certain embodiments of the present invention, is formed using conventional deep-ultraviolet (deep-UV) resist processing techniques. Deep-UV, as used herein, refers to the wavelength(s) of deep-ultraviolet radiation (i.e., between about 100 nm and about 300 nm), which is employed to pattern resist mask 16'. Resist mask 16' includes a plurality of organic-based polymer resin molecules which are configured to adhere to the top surface 15 of feature layer 14 and to prevent the etching of non-exposed portions of the underlying feature layer 14.

The thickness of resist mask 16' varies depending upon the type of patterning process that is to be performed. For example, one factor that is considered when preparing portion 10' for an etching process is the amount of resist material that will be removed (e.g., etched away) during the etching process. Thus, providing an adequately thick resist mask is critical to controlling the etching process. By way of example, in accordance with certain embodiments of the present invention, to etch feature layer 14, which includes a layer of polysilicon that is about 900 to about 1,100 Angstroms thick, resist mask 16 is preferably between about 3,000 and about 6,000 Angstroms thick. In the past, a comparable, conventional resist mask (e.g., resist mask 16 in FIG. 1) would likely be between about 6,000 and about 10,000 Angstroms thick.

Figure 5:
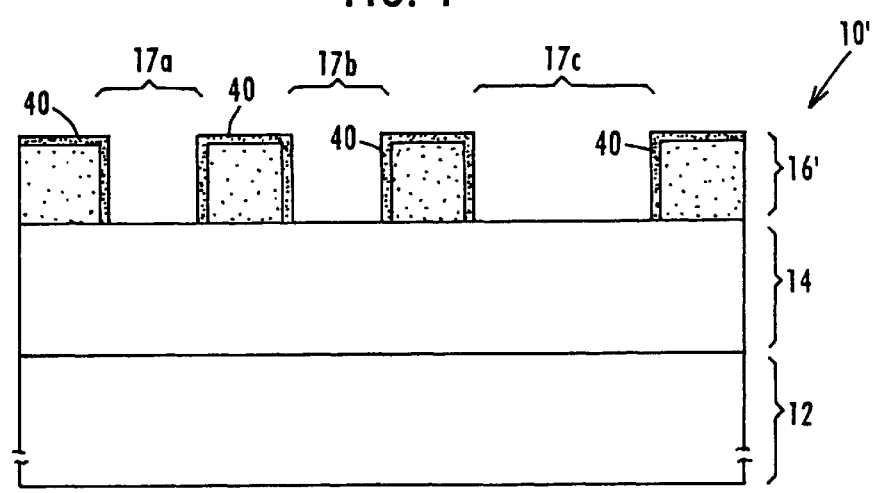
FIG. 5 depicts a cross-sectional view of the portion of FIG. 4 following the formation of a hard resist layer within a resist mask, in accordance with certain embodiments of the present invention.

FIG. 5 depicts portion 10' following the formation of a hard resist layer 40 within resist mask 16', in accordance with certain embodiments of the present invention. As shown, hard resist mask 40 is formed near and/or at the exposed surfaces of resist mask 16'. In the past, hardened resist masks have been formed in resist masks by exposing the resist mask to ultraviolet radiation. However, such techniques are ineffective in a deep-UV resist mask. Thus, there is a need for new methods for forming hard resist layers in a deep-UV resist mask.

In accordance with certain embodiments of the present invention, hard resist layer 40 is formed by exposing resist mask 16' to a rapid thermal anneal (RTA) type of process, for example, using conventional RTA techniques. As part of the RTA type of process, the semiconductor wafer (e.g., 10') is placed into an inert gas (e.g., $N_2$) filled furnace chamber and the temperature in the chamber is quickly increased (i.e., ramped-up) to a higher temperature, maintained at the higher temperature for a period of time, and then quickly decreased (i.e., ramped-down) to a lower temperature. As such, the RTA type of process is configured to raise the temperature of the polymer molecules at and/or near the exposed surfaces of resist mask 16' without significantly heating the remaining polymer molecules in resist mask 16', and/or significantly affecting feature layer 14 and/or substrate 12. The heat energy that is absorbed by the polymer molecules at and/or near the surface of resist mask 16' tends to cause longer, cross-linked chains of polymer molecules to form, thereby resulting in hard resist layer 40 within resist mask 16'. No significant chemical reactions are believed to exist between the inert gas and resist mask 16' during this RTA type of process.

The RTA type of process, in accordance with certain embodiments of the present invention, is significantly shorter and occurs at a lower temperature than a typical RTA process associated with the backend processing that occurs subsequently during device fabrication. By way of example, in accordance with certain embodiments of the present invention, the RTA type of process used to form a hard resist layer 40 in rest mask 16' preferably lasts less than about 60 seconds, and more preferably between about 5 and about 30 seconds. During this short period, the temperature in the chamber is quickly ramped-up (e.g., within a few seconds) to a temperature preferably greater than about 150° C., more preferably to a temperature between about 150° C. and about 450° C., and most preferably to a temperature of about 350° C. Towards the end of the short period, the temperature is then ramped-down (e.g. within a few seconds) to about the initial temperature. Since a typical deep-UV configured resist material has a melting point of about 150° C., any further exposure to the higher temperature could cause resist mask 16' to melt and/or significantly change shape.

As thermal energy is absorbed into the resist material, the bonding between polymer resin molecules near and/or at the surface tends to become cross-linked. These cross-linked molecules tend to be significantly more resistant to the subsequent etching process (e.g., plasma etch, reactive ion etch, etc.), and, therefore, form hard resist layer 40 within resist mask 16'. The hard resist layer 40 prevents resist material residue from being created during subsequent etching processes.

Figure 6:
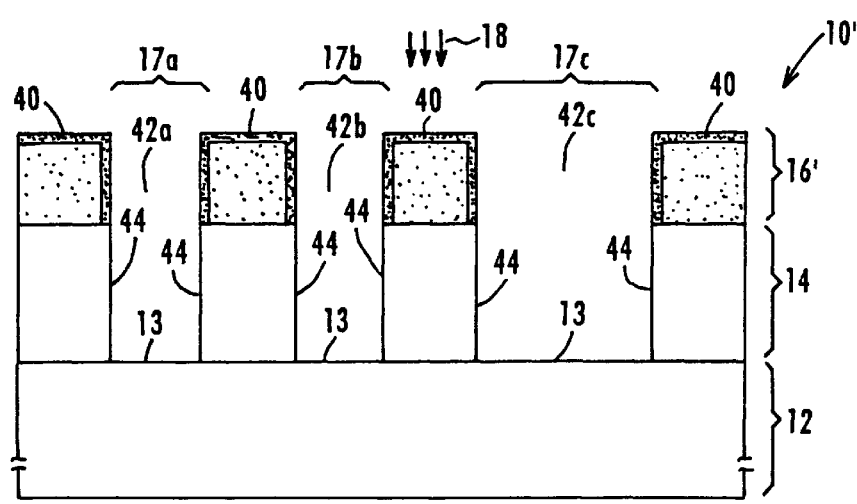
FIG. 6 depicts a cross-sectional view of the portion of FIG. 5 following a selective etching process in which a plurality of device features are patterned through windows in the resist mask having a hard resist layer formed therein, in accordance with certain embodiments of the present invention.

FIG. 6 depicts portion 10' of FIG. 5, following the selective patterning or etching of feature layer 14 using at least one etching mechanism 18, such as, for example, a plasma. As shown, etched openings 42a, 42b and 42c have been formed through windows 17a, 17b and 17c, respectively. Etched openings 42a–c extend through feature layer 14 and expose top surface 13 of substrate 12. Each of the etched openings 42a–c has sidewalls 44, which are substantially vertical with respect to top surface 13 of substrate 12. Thus, by forming hard resist layer 40, the amount of residue formed during the etching process attributable to the resist material has been significantly reduced, if not substantially eliminated, thereby increasing process control.

Figure 3:
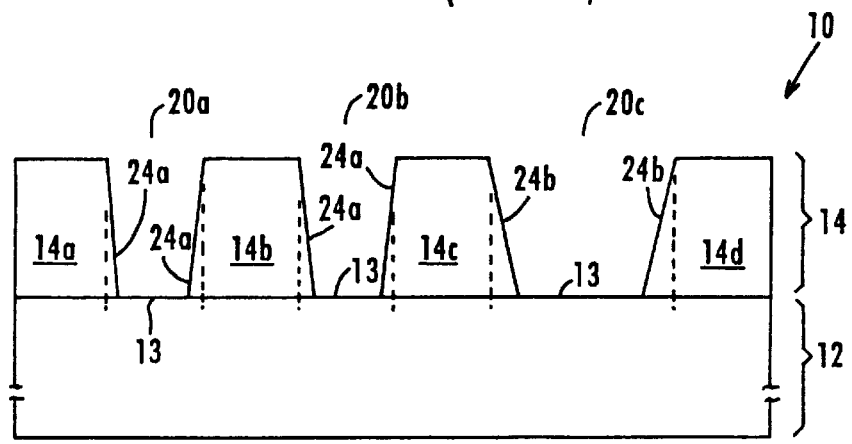
FIG. 3 depicts a cross-sectional view of the portion of FIG. 2 following removal of the conventional resist mask, and the resulting device features.
Figure 7:
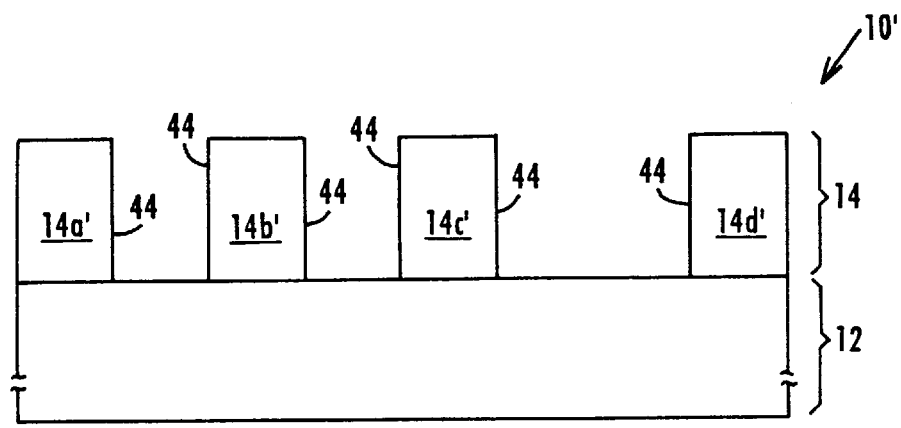
FIG. 7 depicts a cross-sectional view of the portion of FIG. 6 following removal of the resist mask, in accordance with certain embodiments of the present invention.

Resist mask 16' (including hard resist layer 40) is then removed from portion 10' using conventional resist stripping and/or ashing techniques to reveal the patterned device features, such as, for example, device features 14a', 14b', 14c', and 14d', as depicted in FIG. 7. Unlike the device features depicted in FIG. 3, device features 14a–d' in FIG. 7 have substantially vertical profiles and are substantially uniform in shape. For example, device features 14b' and 14c' are about the same size and shape, despite having been formed using different sized windows (see, e.g., FIG. 6). Additionally, because resist mask 16' can be thinner than a conventional resist mask, the critical dimensions of the device features 14a–d', for example, can be further reduced in size.

Figure 8:
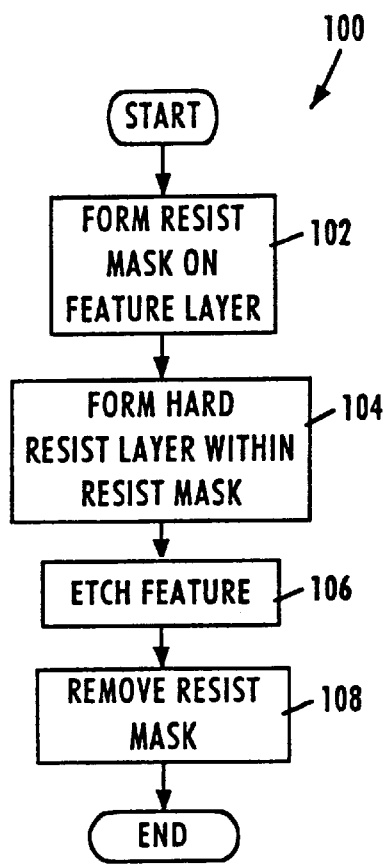
FIG. 8 is a flowchart depicting a process for forming a hard resist layer in a resist mask, in accordance with certain embodiments of the present invention.

FIG. 8 is a flowchart of a method 100 for forming and using a hard resist layer 40, in accordance with certain embodiments of the present invention. In step 102, a resist mask 16' is formed on feature layer 14. Next, in step 104, a hard resist layer 40 is formed within resist mask 16', using thermal treatment techniques as described above. In step 106, feature layer 14 is selectively patterned, for example, using conventional etching techniques. Once the device features have been formed in step 106, then, in the resist mask is removed in step 108.

Despite having been described for use with conventional deep-UV resist materials, it is believed that the methods described above, in accordance with the exemplary embodiments of the present invention, are capable of being used with other conventional resist materials and may be applied to newly developed resist materials, as well.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A method for fabricating a device feature in a semiconductor device, the method comprising:

forming a second layer on a first layer;

forming a resist mask on the second layer, the resist mask having at least one opening that exposes a selected portion of a top surface of the underlying second layer;

raising the temperature of polymer molecules at and/or near the exposed surfaces of the resist mask without significantly heating remaining polymer molecules to form a hard resist layer only near and/or at the exposed surfaces of the resist mask; and etching through the selected portion of the second layer to expose a portion of the first layer.

2. The method as recited in claim 1, wherein the step of raising the temperature of at least a portion of the resist mask further comprises:

placing the semiconductor device in a chamber having an initial temperature that is less than about 150° C.; and raising the temperature in the chamber from the initial temperature to a second temperature that is at least about 150° C. for a defined period of time.

3. The method as recited in claim 2, wherein the step of raising the temperature of at least a portion of the resist mask further comprises, at the end of the defined period of time, lowering the temperature in the chamber from the second temperature to a third temperature that is less than about 150° C.

4. The method as recited in claim 2, wherein the second temperature is between about 150° C. and about 450° C.

5. The method as recited in claim 4, wherein the second temperature is about 350° C.

6. The method as recited in claim 2, wherein the defined period of time is less than about 60 seconds.

7. The method as recited in claim 6, wherein the defined period of time is between about 5 seconds and about 30 seconds.

8. The method as recited in claim 7, wherein the defined period of time is about 20 seconds.

9. The method as recited in claim 2, further comprising filling the chamber with an inert gas.

10. The method as recited in claim 9, wherein the inert gas includes $N_2$ gas.

11. The method as recited in claim 1, wherein the resist mask comprises a deep-ultraviolet (deep-UV) configured resist material.

12. The method as recited in claim 11, wherein the step of forming a resist layer includes depositing the deep-UV configured resist material on the feature layer to a thickness of between about 3,000 Angstroms and about 6,000 Angstroms.

13. The method as recited in claim 1, wherein the device feature is a gate in a transistor device.

14. The method as recited in claim 13, wherein the second layer is a feature layer comprising polysilicon.

15. A method for forming a hardened resist layer within a resist mask using rapid thermal anneal techniques, the method comprising:

forming a resist mask on a top layer of a layer stack, wherein the resist mask comprises a plurality of polymer molecules; and thermally heating at least a portion of the plurality of polymer molecules in the resist mask, sufficient to form a hardened resist layer with cross-linked chains of polymer molecules in the resist mask.

16. The method as recited in claim 15, wherein the step of thermally heating at least a portion of the plurality of polymer molecules in the resist mask comprises rapidly heating for a defined period of time, a portion, but not all, of the plurality of polymer molecules in the resist mask to a linking temperature that is at least about 150° C.

17. The method as recited in claim 16, wherein the linking temperature is between about 150° C. and about 450° C.

18. The method as recited in claim 17, wherein the linking temperature is about 350° C.

19. The method as recited in claim 16, wherein the defined period of time is less than about 60 seconds.

20. The method as recited in claim 19, wherein the defined period of time is between about 5 seconds and about 30 seconds.

* * * * *